United States Patent [19]

Ridinger

[11] Patent Number: 4,724,219
[45] Date of Patent: Feb. 9, 1988

[54] RADIATION MELTING OF SEMICONDUCTOR SURFACE AREAS THROUGH A REMOTE MASK

[75] Inventor: Michael R. Ridinger, Boylston, Mass.

[73] Assignee: Sprague Electric Company, North Adams, Mass.

[21] Appl. No.: 886,126

[22] Filed: Jul. 16, 1986

[51] Int. Cl.$^4$ .................. H01L 21/265; C23F 1/02
[52] U.S. Cl. .................................. 437/19; 156/635;
156/643; 427/53.1; 437/173
[58] Field of Search ................... 148/1.5, 187, 175;
29/576 B, 576 T; 156/635, 643; 427/53.1

[56] References Cited

U.S. PATENT DOCUMENTS

| | | | |
|---|---|---|---|
| 4,181,538 | 1/1980 | Narayan et al. | 148/1.5 |
| 4,278,475 | 7/1981 | Bartko et al. | 148/1.5 |
| 4,490,210 | 12/1984 | Chen et al. | 156/643 |
| 4,529,617 | 7/1985 | Chenevas-Paule et al. | 427/53.1 |
| 4,612,085 | 9/1986 | Jelks et al. | 156/643 |
| 4,643,799 | 2/1987 | Tsujii et al. | 156/643 |

FOREIGN PATENT DOCUMENTS 0034789 8/1984 Japan .................. 156/643

OTHER PUBLICATIONS

Chuang in Mat. Res. Soc. Symp. Proc. 17 (1983) ed. Osgood et al, North-Holland, N.Y., p. 45.

Rothschild et al., J. Vac. Sci. Technol. B-4 (1986), p. 310.
"Direct Writing of Regions of High Doping on Semiconductor by UV-Laser Photodeposition", *Appl. Phys. Lett.* 36(11), Jun. 1, 1980.
"Ultrafast Deep UV Lithography with Excimer Lasers", *IEEE Electron Device Letters*, vol. EDL-3, No. 3, Mar. 1982 by K. Jain et al.
"Excimer Laser Processing of Semiconductors", *Lasers & Applications*, May 1985 by Robert J. Pressley.

*Primary Examiner*—Upendra Roy

[57] ABSTRACT

A method for making semiconductor devices includes selectively simultaneously and momentarily irradiating a semiconductor substrate surface by a pulsed laser through a mask positioned between and spaced away from laser and substrate to briefly melt sub-regions of that surface. An optical beam reducer system is interposed between the relatively large separate mask and the substrate. An optical expander system is interposed between the laser and the mask to further increase the possible mask size and further reduce the radiation density at the mask. Wet photolithographic processing may be eliminated for selective diffusions of dopants, for selective epitaxy, for selectively converting polysilicon layers over silicon substrates to monocrystalline silicon layers and for selectively etching the substrate by a plasma induced by the patterned laser energy. Semiconductor device manufacture may thereby be greatly simplified.

15 Claims, 3 Drawing Figures

RADIATION MELTING OF SEMICONDUCTOR SURFACE AREAS THROUGH A REMOTE MASK

BACKGROUND OF THE INVENTION

This invention relates to a method for making semiconductor devices and more particularly to steps for selectively heating to selectively alter discrete surface areas of a semiconductor substrate.

Almost all present day manufacturing processes for making transistors, light emitting diodes, Hall elements, integrated circuits and the like include many photolithographic mask making steps. Dopant diffusions are selectively effected at the semiconductor substrate surface through the mask. The mask is made by first growing an oxide layer over the substrate surface and coating the surface in a wet process with a photoresist, exposing the photoresist to a pattern of light, applying a liquid etchant to selectively remove the exposed (or unexposed) photoresist areas, and wet etching through the photoresist mask the portions of the oxide layer not covered by photoresist. After use the photoresist mask is dissolved and washed away in other liquids. These wet steps are a source of contaminants, and with the associated photolithography often represent a major portion of the entire manufacturing process.

Recently, there have been numerous proposals for selectively doping by laser irradiation of a semiconductor substrate either using a broad fixed laser beam and a contact laser-beam mask or using a fine moving laser beam (beam writing). The beam writing method is substantially slower because the discrete areas of the substrate are sequentially irradiated. The contact resin (photoresist) mask of the formerly mentioned method is made by wet photolithographic steps.

On the other hand, it has been suggested to use a laser in the making of photoresist masks themselves, whereby the laser beam passes through a separate remote mask and is optically reduced before illuminating the photoresist. The optical reduction decreases the amount of laser energy at the remote mask. However, this suggested process still requires removal of the photoresist mask from the substrate, e.g. by the dissolution and washing away of the photoresist and rinsing, and requires regrowth of a new oxide for the next step.

It is an object of this invention to provide a simpler method for making a semiconductor device including steps for selectively treating discrete surface areas of a semiconductor substrate using fewer steps and mainly dry steps.

It is a further object of this invention to provide such steps that effect selective doping of the substrate discrete areas.

It is yet a further object of this invention to provide such steps that effect epitaxial growth at the substrate discrete areas.

It is still a further object of this invention to selectively heat and melt portions of a semiconductor substrate surface with a laser beam having been patterned through a large remote mask.

SUMMARY OF THE INVENTION

A method for making semiconductor devices, such as integrated circuits, includes simultaneously heating separate discrete surface areas of a semiconductor substrate that may be a monocrystalline semiconductor die on which one integrated circuit is to be formed or may be a wafer from which many such die are to be cut.

The selective heating is accomplished by positioning a mask between the substrate and a source of electromagnetic radiation of a type that is capable of heating the portions of the above-noted substrate that it impinges upon. The mask is spaced away from the substrate and a reducing lens placed between the mask and the substrate. The mask is preferably at least one order of magnitude larger than the patterned heating radiation impinging on the substrate surface.

The reducing lens is preferably followed by a collimating lens in the path of the patterned laser beam so that the distance between the substrate and the reducing lens is rendered non-critical.

The source of radiation presently most suitable is a laser source that provides the necessarily high energy radiation pulses of short duration (0.015 to 1.0 microsecond). In general, the wavelength of the laser energy may be within the range including the ultraviolet and the visible regions, namely about from 0.015 to 1.0 micron. Pulsed lasers now exist having so great a pulse energy output capability that any metallized mask would be destroyed by it, and furthermore, others of vastly greater power are in development.

An important feature of this invention is the capability to harness very high beam energy lasers toward a more efficient production of semiconductor devices. Thus, the employment of an expanding (magnifying) lens between the laser and the mask to further reduce the radiation energy density at the mask may be necessary. A collimating lens is used in conjunction with and following the expanding lens to present a collimated beam of radiation to the mask.

The suitable mask is made of a radiation transparent plate on which has been deposited a patterned metal film that has a high reflectivity and is also substantially opaque to the type of radiation produced by the above-noted source. Such a mask is accomplished by forming on a quartz plate a vacuum evaporated aluminum film. The aluminum film may be a few thousand angstroms thick that is patterned by the standard photolithographic steps of forming over the film an apertured photoresist layer and etching away the aluminum to form windows therein in discrete regions corresponding to apertures in the photoresist layer. Some opaque resin layers, such as photoresist layers, may be unsuitable as the masking layer in the method of this invention because of their lower reflectivity and their greater tendency to deteriorate even at moderate elevated temperatures. However, the use of radiation transparent resin or organic materials of high transmissivity in large masks of this invention may be employed as the transparent plate or as a coating to retard oxidation of the metal film that may in time reduce its opacity and reflectivity.

Using a radiation tolerant mask such as aluminum film on a quartz plate it is estimated that the reducing optics should provide a demagnification factor of at least 10, but when the less reflective but higher melting chromium film mask is used a demagnification factor of about 100 or more is indicated. Even greater demagnification factors, e.g. 1000, are desirable to permit making the mask at the same scale as the original art work.

Therefore, this invention recognizes that with such large remote masks, there are no lasers providing a broad enough beam to fully illuminate such masks and, in this case, a beam-expanding optical system is located between the laser and the mask. With demagnification factors greater than about 100 the irradiation densities at the mask are so reduced that masks of laminated plastic materials such as polyurethane, polyimide and polyethyleneterephalate may be used depending, of course, upon their transmissivity at the wavelength of the laser employed. Such plastics may be rendered opaque by loading them with dyes or pigments. It is anticipated that by means of the pulsed laser melting method of this invention, great reductions in the number of process steps and costs of manufacturing a semiconductor may be realized.

DESCRIPTION OF THE PREFERRED EMBODIMENTS

A standard monocrystalline P-type silicon wafer of several inches diameter was prepared by growing on one major surface thereof an N-type epitaxial layer of about 10 microns thickness and 5 ohm-centimeters resistivity. A liquid P-type dopant compound that is a precursor of boron was spin coated over the surface of the epitaxial layer to a thickness of about 0.15 micron. This particular dopant precursor was supplied by Allied Chemical Corp. as part number B-150.

Figure 1:
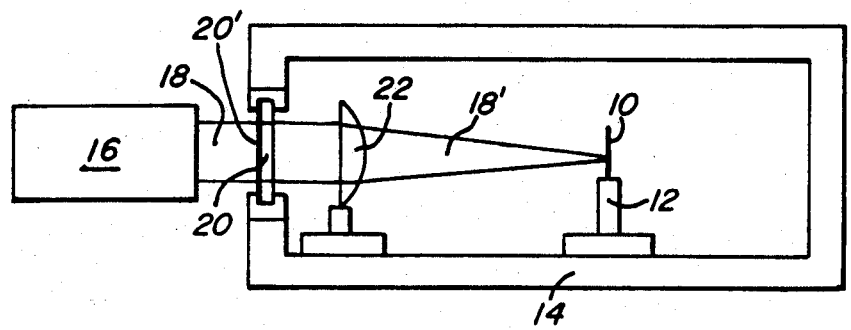
FIG. 1 shows a diagram, not to scale, of a laser irradiation system for selectively melting the surface of a semiconductor substrate according to a first preferred embodiment of this invention.

Referring to FIG. 1, the wafer 10 having been prepared as described above, is held with the epitaxial surface (not depicted) facing right by a fixture 12 within a gas tight enclosure 14. A laser 16 positioned outside the enclosure 14 is aimed in the direction of the wafer 10 so that its beam 18 is perpendicular to the surface of the epitaxial layer.

A mask 20 mounted in and sealed to a port in the wall of the enclosure 14 is located between the laser 16 and the wafer 10. The mask 20 in this case consists of a quartz plate having an aluminum film 20' deposited on the left hand face of the mask plate. The aluminum film of several thousand angstroms has an aperture or window therein through which a portion of the beam 18 passes.

A quartz lens 22 with a focal length of 12 inches (30 cm.) is interposed between the mask 20 and the wafer 10 to reduce the image of the masked beam 18' at the wafer 10, in this instance by a factor of 10.

The laser 16 is a Lambda Physik 150 EST Eximer Laser System that produces a collimated beam 18 at an ultraviolet wave length of 0.308 microns. Beam 18 is about rectangular measuring 1×3 centimeters across. Silicon efficiently absorbs ultraviolet radiation of this wave length and is thus efficiently heated by it, whereas the quartz lens 22 and the quartz plate of mask 20 is essentially transparent at this wavelength. Finally the aluminum film of mask 20 has a relative reflectivity of about 90% at this wavelength. The opaque aluminum absorbs and is heated by about 10% of the beam energy.

This laser 10 provides a pulse of radiation about 18 nano-seconds duration and is capable of being pulsed at intervals of a few tenths of seconds. A burst may include one or more pulses. For the laser beam intensity just great enough to melt silicon (of melting point 1410° C.) the energy density of the laser radiation at the mask will be reduced below the point at which the aluminum film (of melting point 660° C.) will be destroyed.

Using the arrangement of FIG. 1, the portion 18' of the laser beam 18 is convergent and not collimated, conveniently allowing an experimenter to vary the distance between the lens 22 and the wafer 10 to adjust the laser beam energy density at the wafer. By this means it was determined that at a laser beam intensity of 100 millijoules per square centimeter at the mask, the aluminum will not be destroyed and at a separation between the lens 22 and wafer 10 of 10.75 inches (27.3 cm) the beam energy at the wafer is about 1 joule per square centimeter. With just one laser pulse, the epitaxial surface is momentarily melted and doped with boron to a depth of about 0.1 micron forming a PN junction there.

It was also determined that under these conditions an increase in radiant energy density at the wafer of about 250% was effected and the momentarily molten silicon was hot enough to boil and splatter so as to ruin any device that might otherwise have been formed there. On the other hand, for a reduction of the radiant energy at the wafer of just 60% below 1 joule/cm², transient melting of the silicon was no longer effected and no usable PN junction was formed.

The above-described embodiment of the method is only practical for manufacturing semiconductor devices when the radiated pattern of the mask is in focus at the wafer that must lie in the image plane of the lens. Furthermore, it is only practical for irradiating a small target area. This limitation is illustrated by noting that the laser beam 18 in the above-given example has a cross sectional area of 3 square centimeters. This area is reduced at wafer 10 by the lens 22 by a factor of 10 to 0.3 square centimeter.

Figure 2:
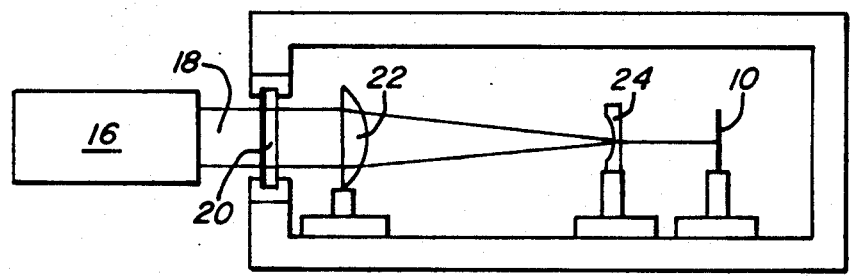
FIG. 2 shows modification of the system of FIG. 1 according to a second preferred embodiment of this invention.

For small wafers that relative size limitation is not important because the wafer area and the beam pattern size may be commensurate. Also, it is preferred to insert at the image plane of reducing lens 22 a collimating lens 24 as is shown in FIG. 2. Now the beam-pattern image at the wafer 10 is no longer a function of the distance between the wafer 10 and the optics.

However, when it is required to simultaneously irradiate sub-areas scattered about the whole surface of a standard semiconductor wafer, e.g. a silicon wafer having a diameter of 3 inches (7.6 cm) to 6 inches (16.3 cm), the laser must be capable of generating much greater power. A large-wafer irradiation system wherein any point in the entire wafer surface may be simultaneously heated and melted by one pulse of the laser is shown in FIG. 3.

A laser 30 is positioned to direct a laser beam 32 first through a beam expander lens 34 and then a collimating lens 36. The beam expanding optics system including lenses 34 and 36 transforms the collimated laser beam 32 to a collimated beam 38 that has a reduced radiation energy density. A mask 40 in the path of beam 38 is thus exposed to less intense heating than if it were in the path of the beam 32 directly emitted from laser 30.

Figure 3:
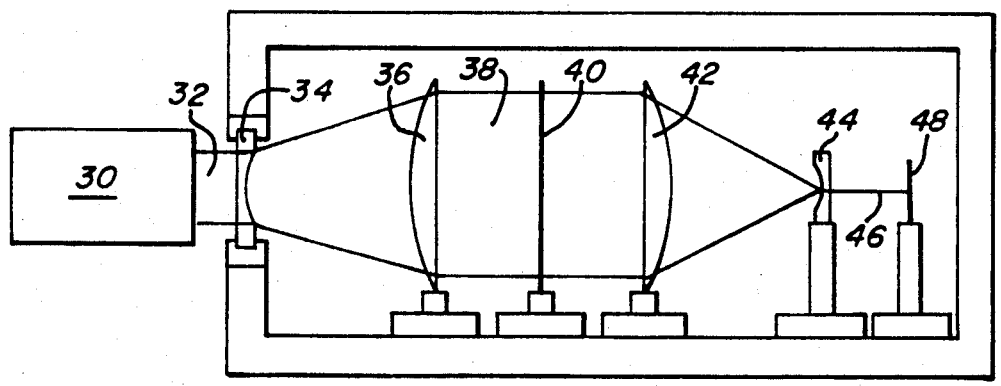
FIG. 3 shows a diagram, not to scale, of a laser irradiation system for selectively melting the surface of a semiconductor substrate according to a third preferred embodiment of this invention.

Although lens 42 and mask 40 are shown spaced apart for clarity in FIG. 3, it is preferred to place them close together or in contact for improving the resolution that can be obtained from this optical system.

The patterned radiation transmitted from the mask 40 passes through a reduction optics system consisting of a reduction lens 42 and a collimating lens 44. Thus the radiation energy density of the active-pattern portions of this beam 46 that directly impinges upon wafer 48 may be made great enough by the reduction optics system to melt the irradiated surface portions of the wafer.

Slight inhomogeneities in substrate surface areas having been laser melted and recrystallized indicate inhomogeneous energy density in the laser beam. Correction is expected to be effected by using a diffuser plate, e.g. a ground or etched quartz, between the laser and the mask.

Selective diffusion of dopants into surface regions of a semiconductor may be accomplished very simply using the laser treatment methods described above. Instead of the multiple steps conventionally employed for growing an oxide and photolithographically forming openings in the oxide layer through which the semiconductor surface is selectively doped, the bare wafer surface may be selectively heated by the above-described method in an atmosphere of a gasseous dopant. Alternatively, the wafer surface may be spin coated with a liquid dopant prior to being subjected to the laser heating to effect a laser induced doping of selected regions of the semiconductor wafer.

Similarly, selective epitaxy over a semiconductor substrate can be accomplished by the laser treatment process of this invention with the substrate surrounded be a gaseous precursor of the substrate material, e.g. a silane for a silicon substrate.

Likewise, a layer of polycrystalline semiconductor material may be selectively heat treated by the method of this invention to either increase the grain size in selected portions of the layer or completely convert the selected portions to a monocrystalline layer. In either case, the small grained polysilicon may be subsequently etched away leaving most of the heat-treated material. The etching rate of monocrystalline silicon is typically at 1300 angstroms per second compared to an etching rate of 5000 angstroms per second for polysilicon.

It is also anticipated that selective etching of the semiconductor substrate may be accomplished by a pulse of laser energy at a semiconductor wafer surface that is contacted by a gasseous or a liquid etchant. The etchant may be plasma induced by the laser energy at the selected areas.

What is claimed is:

1. A method for making semiconductor devices including simultaneously selectively heating discrete regions of a semiconductor substrate comprising:
   positioning a mask spaced from a surface of said semiconductor substrate, said mask having regions that are opaque to one type of electromagnetic radiation which type radiation is capable of heating said substrate, and having separate regions that are windows essentially transparent to said one type radiation;
   positioning an optical beam reducer between said mask and said substrate to demagnify the pattern of said radiation transmitted through said separate mask regions by at least one order of magnitude at said substrate surface; and
   directing a burst of said one type radiation through said mask at separate regions of said substrate surface corresponding respectively to said separate mask regions to simultaneously momentarily heat and melt said separate substrate surface regions, so that the density of said radiation at said opaque regions of said mask is at least ten times less than the density of said radiation effecting melting at said substrate surface.

2. The method of claim 1 wherein said substrate is silicon and said one type electromagnetic radiation is one having a wavelength of from 0.015 to 1.1 microns.

3. The method of claim 1 wherein said source is a laser source of said one type radiation.

4. The method of claim 1 additionally comprising placing a collimating lens between said beam reducer and said substrate to collimate the patterned radiation impinging upon said substrate.

5. The method of claim 4 wherein the demagnifying factor of said optical beam reducer is greater than 100 so that the transparent windows pattern in said mask is greater than 100 times the corresponding radiation pattern at said substrate.

6. The method of claim 1 adapted for diffusing impurities into said semiconductor substrate additionally comprising uniformly contacting said semiconductor substrate surface with impurity atoms so that at said separate melted substrate regions said impurity atoms rapidly diffuse and dope said surface regions.

7. The method of claim 1 adapted for providing a monocrystalline semiconductor layer on said separate regions of said semiconductor substrate wherein said substrate is a said monocrystalline semiconductor material, additionally comprising depositing a layer of polycrystalline material of said material over said monocrystalline substrate of said semiconductor material to contact at least a portion of said monocrystalline substrate and convert sub-areas of said polycrystalline layer corresponding to said mask windows to an epitaxial monocrystalline layer.

8. The method of claim 1 additionally comprising exposing said substrate to a chemical etchant for said polycrystalline material to etch away the unradiated portion of said polysilicon layer.

9. The method of claim 1 adapted for providing an epitaxial layer on said separate regions of said semiconductor substrate wherein said substrate is of a monocrystalline material, additionally comprising providing over said semiconductor substrate surface a gaseous precursor compound of said material; and to selectively decompose the gaseous precursor compound adjacent to said irradiated substrate regions and to selectively grow on said regions a monocrystalline epitaxial layer of said material.

10. The method of claim 5 wherein said directing a burst of said radiation additionally comprises positioning an optical beam-expander between said laser source and said mask for magnifying and collimating said radiation at said mask.

11. The method of claim 6 wherein said uniformly contacting is accomplished by depositing a thin coating containing said impurity atoms directly on said surface.

12. The method of claim 6 wherein said uniformly contacting is accomplished by providing a gaseous atmosphere containing said impurity atoms directly adjacent to said surface, said directing said radiation being through said gas to said substrate surface.

13. The method of claim 9 wherein said semiconductor material is silicon and said precursor compound is silane.

14. The method of claim 9 wherein said gaseous atmosphere additonally includes a conductivity-imparting dopant to uniformly dope said epitaxial layer simultaneously with said heating to grow said epitaxial layer.

15. The method of claim 10 wherein said transparent regions of said mask are of a plastic material.

* * * * *

UNITED STATES PATENT AND TRADEMARK OFFICE
CERTIFICATE OF CORRECTION

PATENT NO. : 4,724,219
DATED : February 9, 1988
INVENTOR(S) : Michael R. Ridinger It is certified that error appears in the above—identified patent and that said Letters Patent is hereby corrected as shown below:

Claim 5, line 1, "claim 4" should read -- claim 1 --

Signed and Sealed this

Twenty-sixth Day of July, 1988

Attest:

DONALD J. QUIGG

*Attesting Officer*  *Commissioner of Patents and Trademarks*